(12) United States Patent
Fasheh et al.

(10) Patent No.: US 7,381,969 B2
(45) Date of Patent: Jun. 3, 2008

(54) LOAD LOCK CONTROL

(75) Inventors: Tariq Fasheh, Beverly, MA (US);
James Carroll, Amesbury, MA (US);
Klaus Petry, Merrimack, MA (US);
Dale Stone, Lynnfield, MA (US);
Lyudmila Stone, Lynnfield, MA (US);
Dave Wiederspahn, Cambridge, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 256 days.

(21) Appl. No.: 11/409,759

(22) Filed: Apr. 24, 2006

(65) Prior Publication Data

US 2007/0246658 A1     Oct. 25, 2007

(51) Int. Cl.
*H01J 37/18*     (2006.01)

(52) U.S. Cl. .................. 250/441.11; 73/724; 414/217; 414/939; 118/719; 204/298.25; 204/298.35

(58) Field of Classification Search .......... 250/441.11; 73/724; 414/217, 939; 118/719; 204/298.25, 204/298.35
See application file for complete search history.

(56) References Cited

U.S. PATENT DOCUMENTS

| | | | |
|---|---|---|---|
| 5,314,541 A | 5/1994 | Saito et al. | |
| 5,913,978 A | 6/1999 | Kato et al. | |
| 6,264,706 B1 | 7/2001 | Hirano | |
| 6,672,171 B2 * | 1/2004 | Gu et al. | 73/724 |
| 2001/0029889 A1 | 10/2001 | Holcomb et al. | |

FOREIGN PATENT DOCUMENTS

EP     1596421     11/2005

* cited by examiner

*Primary Examiner*—Kiet T Nguyen
(74) *Attorney, Agent, or Firm*—Tarolli, Sundheim, Covell & Tummino LLP

(57) ABSTRACT

A control for pressurizing a load lock. The control initiates pressurization of the loadlock interior by coupling a source of gas to the loadlock interior. A representative load lock includes a pressure sensor and multiple valves to atmosphere where at least one such valves is a passthrough valve for removal of and insertion of workpieces from and into a load lock interior. A second fast acting valve also opens to atmosphere. A pressure rise inside the loadlock interior is monitored and when the pressure reaches a threshold pressure above atmosphere the fast acting valve is opened to atmosphere. This second fast acting valve is configured to relieve overpressure from the passthrough valve prior to opening of said passthrough valve. Workpiece movement is accomplished with the aid of a robot which reaches into the loadlock interior as it is either depositing workpieces or retrieving them. This system and process minimizes particle contamination of the load lock interior as well as contamination in the region outside the loadlock near the passthrough valve and any scheduled workpieces.

11 Claims, 4 Drawing Sheets

LOAD LOCK CONTROL

FIELD OF THE INVENTION

The present invention relates to a load lock for moving a workpiece between atmosphere and an evacuated region in a semiconductor equipment processing tool. One such tool is an ion implanter but other tools that utilize loadlocks are known in the art of semiconductor equipment processing.

BACKGROUND ART

Ion implanters can be used to treat silicon wafers by bombardment of the wafers with an ion beam. One use of such beam treatment is to selectively dope the wafers with impurities of controlled concentration to yield a semiconductor material during fabrication of integrated circuits.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes that energize and direct the flow of ions from the source. The desired ions are separated from byproducts of the ion source in a mass analysis device, typically a magnetic dipole performing mass dispersion of the extracted ion beam. The beam transport device, typically a vacuum system containing an optical train of focusing devices transports the ion beam to the wafer processing device while maintaining desired optical properties of the ion beam. Finally, semiconductor wafers are implanted in the wafer processing device.

Batch processing ion implanters include a spinning disk support for moving multiple silicon wafers through the ion beam. The ion beam impacts the wafer surface as the support rotates the wafers through the ion beam.

Serial implanters treat one wafer at a time. The wafers are supported in a cassette and are withdrawn one at time and placed on a support. The wafer is then oriented in an implantation orientation so that the ion beam strikes the single wafer. These serial implanters use beam shaping electronics to deflect the beam from its initial trajectory and often are used in conjunction with coordinated wafer support movements to selectively dope or treat the entire wafer surface.

Both batch and serial implanters use load locks to move wafers into and out of an evacuated implant chamber. A generic load lock vent sequence begins by isolating the loadlock interior from vacuum and opening a venting valve to allow gas at a regulated pressure to enter the loadlock chamber. The chamber pressure is monitored until a desired set point is reached and once that set point is reached at or near atmosphere, the gas vent is turned off and the loadlock is opened to atmosphere.

U.S. Pat. No. 5,913,978 concerns a system wherein gas is supplied to a first chamber so that the pressure in that chamber is raised to a predetermined level. A communication passage is provided for internally connecting another chamber and the first chamber. When the pressure in the first chamber attains the predetermined level, the gas is allowed to flow from the second chamber into the first chamber through the communication passage. A gas flow can be checked when an open-close door is opened to connect the chambers. Thus, there is no substantial gas flow, so that particles can be prevented from being dislodged.

SUMMARY

The disclosure relates to method and apparatus for transferring a workpiece from one pressure region to a second pressure region. A disclosed load lock has a loadlock interior and a first throughpassage which opens and closes for moving workpieces into and out of the loadlock. This first throughpassage opens to atmosphere. A second throughpassage opens and closes to allow movement of a workpiece into and out of the loadlock and opens to an evacuated region of the implanter where ion implantation occurs.

Before opening the first throughpassage to atmosphere a control initiates pressurization of the loadlock interior by coupling a source of gas to the loadlock interior. A pressure rise inside the loadlock interior is monitored and when the pressure reaches a threshold pressure above atmosphere a pressure relieving, fast acting valve is opened to atmosphere. The first throughpassage is then opened to allow workpieces to be inserted into the loadlock or alternately allow workpieces within the loadlock to be removed. Workpiece movement is accomplished with the aid of a robot which reaches into the loadlock interior as it is either depositing workpieces or retrieving them. This process minimizes particle contamination of the load lock interior as well as contamination in the region outside the loadlock near the throughpassages.

Further features of the disclosure will become apparent to those skilled in the art to which the present invention relates from reading the following specification with reference to the accompanying drawings.

EXEMPLARY EMBODIMENT FOR PRACTICING THE INVENTION

Figure 1:
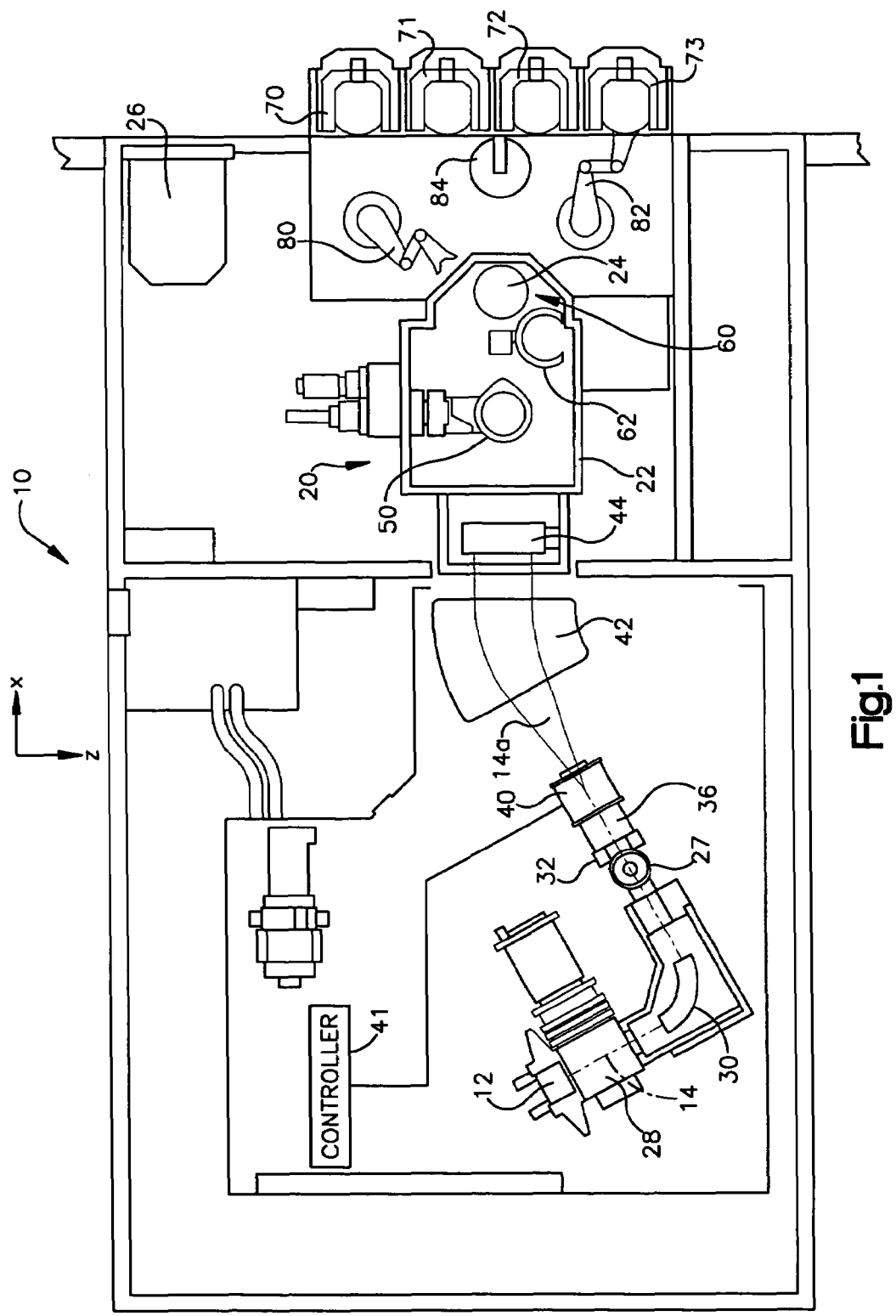
FIG. 1 is schematic view of an ion implanter for ion beam treatment of a workpiece such as a silicon wafer mounted on a support.

Turning to the drawings, FIG. 1 illustrates a schematic depiction of an ion beam implanter 10. The implanter includes an ion source 12 for creating ions that form an ion beam 14 which is shaped and selectively deflected to traverse a beam path to an end or implantation station 20. The implantation station includes a vacuum or implantation chamber 22 defining an interior region in which a workpiece 24 such as a semiconductor wafer is positioned for implantation by ions that make up the ion beam 14. Control electronics indicated schematically as a controller 41 are provided for monitoring and controlling the ion dosage received by the workpiece 24. Operator input to the control electronics are performed via a user control console 26 located near the end station 20. The ions in the ion beam 14 tend to diverge as the beam traverses a region between the source and the implantation chamber. To reduce this divergence, the region is maintained at low pressure by one or more vacuum pumps 27.

The ion source 12 includes a plasma chamber defining an interior region into which source materials are injected. The source materials may include an ionizable gas or vaporized source material. Ions generated within the plasma chamber are extracted from the chamber by ion beam extraction assembly 28 which includes a number of metallic electrodes for creating an ion accelerating electric field.

Positioned along the beam path 16 is an analyzing magnet 30 which bends the ion beam 14 and directs it through a beam shutter 32. Subsequent to the beam shutter 32, the beam 14 passes through a quadrupole lens system 36 that focuses the beam 14. The beam then passes through a deflection magnet 40 which is controlled by the controller 41. The controller 41 provides an alternating current signal to the conductive windings of the magnet 40 which in turn caused the ion beam 14 to repetitively deflect or scan from side to side at a frequency of several hundred Hertz. In one disclosed embodiment, scanning frequencies of from 200 to 300 Hertz are used. This deflection or side to side scanning generates a thin, fan shaped ribbon ion beam 14a.

Ions within the fan shaped ribbon beam follow diverging paths after they leave the magnet 40. The ions enter a parallelizing magnet 42 wherein the ions that make up the beam 14a are again bent by varying amounts so that they exit the parallelizing magnet 42 moving along generally parallel beam paths. The ions then enter an energy filter 44 that deflects the ions downward (y-direction in FIG. 1) due to their charge. This removes neutral particles that have entered the beam during the upstream beam shaping that takes place.

The ribbon ion beam 14a that exits the parallelizing magnet 42 is an ion beam with a cross-section essentially forming a very narrow rectangle that is, a beam that extends in one direction, e.g., has a vertical extent that is limited (e.g. approx ½ inch) and has an extent in the orthogonal direction that widens outwardly due to the scanning or deflecting caused to the magnet 40 to completely cover a diameter of a workpiece such as a silicon wafer.

Generally, the extent of the ribbon ion beam 14a is sufficient to, when scanned, implant an entire surface of the workpiece 24. Assume the workpiece 24 has a horizontal dimension of 300 mm. (or a diameter of 300 mm.). The magnet 40 will deflect the beam such that a horizontal extent of the ribbon ion beam 14a, upon striking the implantation surface of the workpiece 24 within the implantation chamber 22, will be at least 300 mm.

A workpiece support structure 50 both supports and moves the workpiece 24 (up and down in the y direction) with respect to the ribbon ion beam 14 during implantation such that an entire implantation surface of the workpiece 24 is uniformly implanted with ions. Since the implantation chamber interior region is evacuated, workpieces must enter and exit the chamber through a loadlock 60. A robot 62 positioned within the implantation chamber 22 moves wafer workpieces to and from the loadlock 60. A workpiece 24 is schematically shown in a horizontal position within the load lock 60 in FIG. 1. The robot 62 moves the workpiece 24 from the load lock 60 to the support 50 by means of an arm which reaches into the loadlock 60 to capture a workpiece for movement within the evacuated region of the implantation chamber. Prior to implantation, the workpiece support structure 50 rotates the workpiece 24 to a vertical or near vertical position for implantation. If the workpiece 24 is vertical, that is, normal with respect to the ion beam 14, the implantation angle or angle of incidence between the ion beam and the normal to the workpiece surface is 0 degrees.

In a typical implantation operation, undoped workpieces (typically semiconductor wafers) are retrieved from one of a number of cassettes 70-73 by one of two robots 80, 82 which move a workpiece 24 to an orienter 84, where the workpiece 24 is rotated to a particular orientation. A robot arm retrieves the oriented workpiece 24 and moves it into the load lock 60. The load lock closes and is pumped down to a desired vacuum, and then opens into the implantation chamber 22. The robotic arm 62 grasps the workpiece 24, brings it within the implantation chamber 22 and places it on an electrostatic clamp or chuck of the workpiece support structure 50. The electrostatic clamp is energized to hold the workpiece 24 in place during implantation. Suitable electrostatic clamps are disclosed in U.S. Pat. Nos. 5,436,790, issued to Blake et al. on Jul. 25, 1995 and 5,444,597, issued to Blake et al. on Aug. 22, 1995, both of which are assigned to the assignee of the present invention. Both the '790 and '597 patents are incorporated herein in their respective entireties by reference.

After ion beam processing of the workpiece 24, the workpiece support structure 50 returns the workpiece 24 to a horizontal position and the electrostatic clamp is de-energized to release the workpiece. The arm 62 grasps the workpiece 24 after such ion beam treatment and moves it from the support 50 back into the load lock 60. In accordance with an alternate design the load lock has a top and a bottom region that are independently evacuated and pressurized and in this alternate embodiment a second robotic arm (not shown) at the implantation station 20 grasps the implanted workpiece 24 and moves it from the implantation chamber 22 back to the load lock 60. From the load lock 60, a robotic arm of one of the robots moves the implanted workpiece 24 back to one of the cassettes 70-73 and most typically to the cassette from which it was initially withdrawn.

Figure 2:
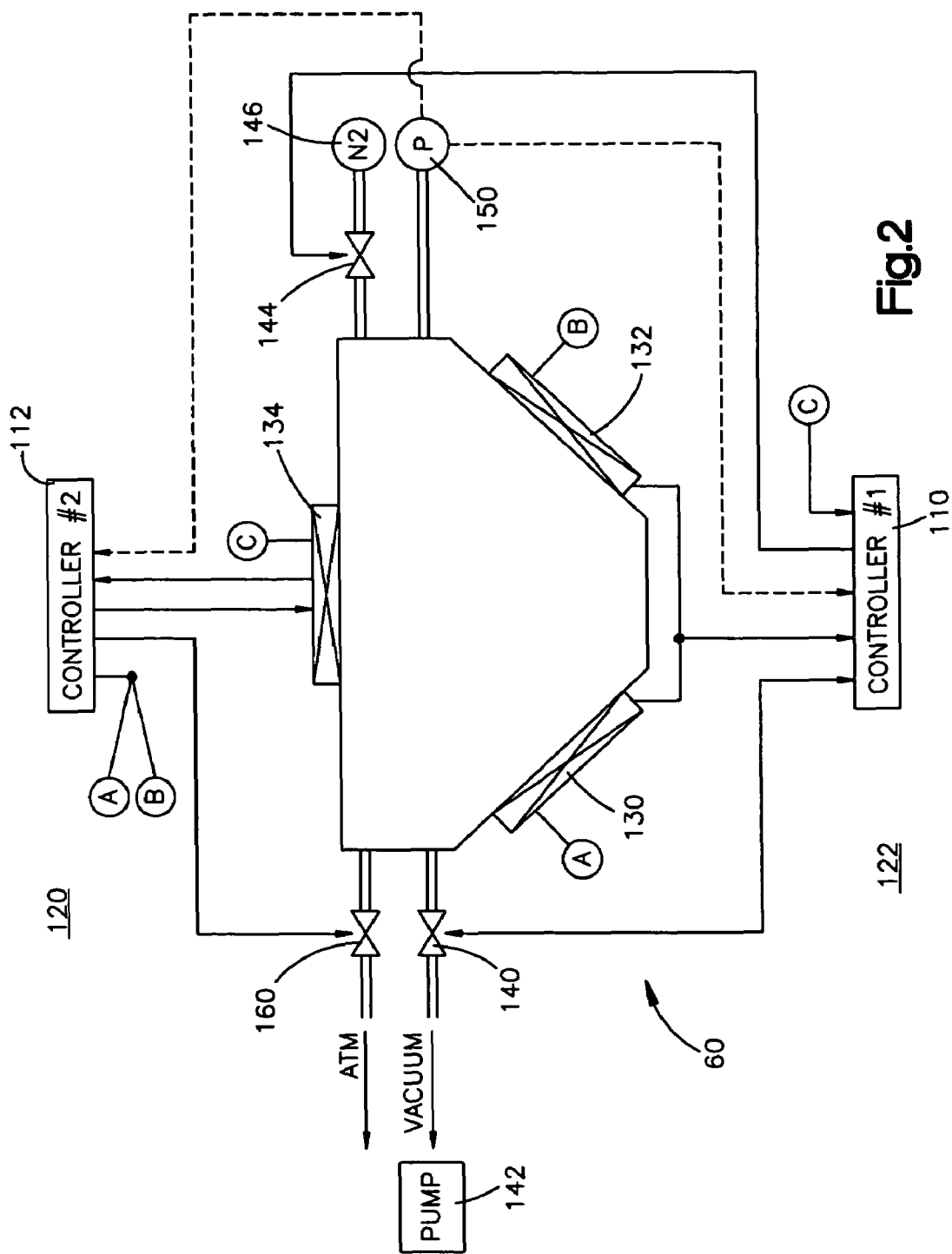
FIG. 2 is a schematic depiction of a load lock for transferring workpieces to and from an evacuated environment of the ion implanter.

The loadlock 60 is schematically depicted in FIG. 2. It is coupled to first and second controllers 110, 112 which control the opening and closing of the various valves and movements of robots required for moving workpieces into and out of the load lock to both an evacuated region 120 where ion implantation occurs and a region 122 at atmosphere where the workpieces are stored in the four cassettes 70-73. One suitable load lock for use with the invention is disclosed in published united states patent application 2005: 0232727 to Ferrara entitled "Workpiece Processing system" and which is incorporated herein by reference. A loadlock interior is accessed from the atmosphere region 122 for wafer insertion and removal by first and second doors 130,132 which functions as a workpiece passthrough valve or passageway. A third door or valve 134 opens into the evacuated region 120 for movement of workpieces to and from the ion implantation chamber.

Loadlock Venting

Assume one of a series of wafers has been inserted into the loadlock 60 that has been treated or processed. In one illustrative embodiment the processing is by bombardment with ions in a controlled ion beam. The loadlock isolation valve 134 through which the workpiece is moved is then closed to decouple the loadlock interior from the vacuum maintained in the implantation chamber 22. A loadlock roughing valve 140 has previously been closed by the controller 110 to decouple the load lock from a roughing pump 142 which initially evacuates the loadlock before the loadlock is opened to the vacuum of the implantation chamber. A venting gas, in the illustrated embodiment Nitrogen, is introduced through a vent valve 144 from a nitrogen source 146 and directed into the loadlock chamber. This valve 144 remains open and gas continues to be introduced into the loadlock interior throughout the disclosed vent sequence. A pressure gauge or sensor 150 monitors gas pressure within the interior of the loadlock and allows the controller 110 to wait for two pre-configured set point or threshold pressures.

In the exemplary embodiment, a first set point is set to approximately 110 Torr below ambient atmospheric pressure. This is 650 Torr for standard atmospheric pressure at sea level. (See FIG. 4, "A"). Receipt of a signal from the sensor 150 indicating this pressure is reached due to gas flow into the loadlock and causes the controller 110 to initiate an atmospheric loadlock isolation valve open sequence. In the illustrated embodiment the controller 110 is one of a number of general purpose computer controllers that has interfaces with a number of implanter sensors and components of the implanter 10. The controller 110 is responsible for a number of functions relating to ion implanter scheduling. The second controller 112 is a special purpose controller and more specifically is a PLC controller. The controller 112 is fast acting and provides dedicated control that significantly reduces timing variability from one vent cycle to the next.

Although the first setpoint can be adjusted, the first set point is set low enough to allow the software and hardware components performing the vent operation sufficient time to process the information and provide a command output. Triggering off this first set point removes the tool level controls performed by the controller 110 and any resultant variability in timing from the control sequence such that the venting operation can continue with minimal delay and minimal variability. Receipt of the first set point is communicated from the first controller 110 to the second controller 112 and arms the second controller for receipt of a second triggering event based on sensing a second threshold. In the exemplary embodiment two controllers 110, 112 are used to perform a venting operation but it is possible one controller could perform all such functions. Such controller could employ a real time operating system with a fast processor and direct interfacing with the components depicted in FIG. 2. Direct connection between the dedicated controller 112, for example, minimizes the layers necessary for communicating and activating the various functions and actuations of the mechanisms. The exemplary implanter 10, however, uses a distributed architecture having multiple controllers. Some of the controllers such as the controller 112 include real-time operating systems while others do not. The controller 112 must provide a fast acting, repeatable control sequence with a minimum of timing variation between cycles. Having a localized controller 112 with purely electronic and pneumatic signals actuating the vent mechanisms achieves this goal. One function of the controller 110 is to arm or make ready the controller 112 to perform the additional steps in the vent process.

Figure 4:
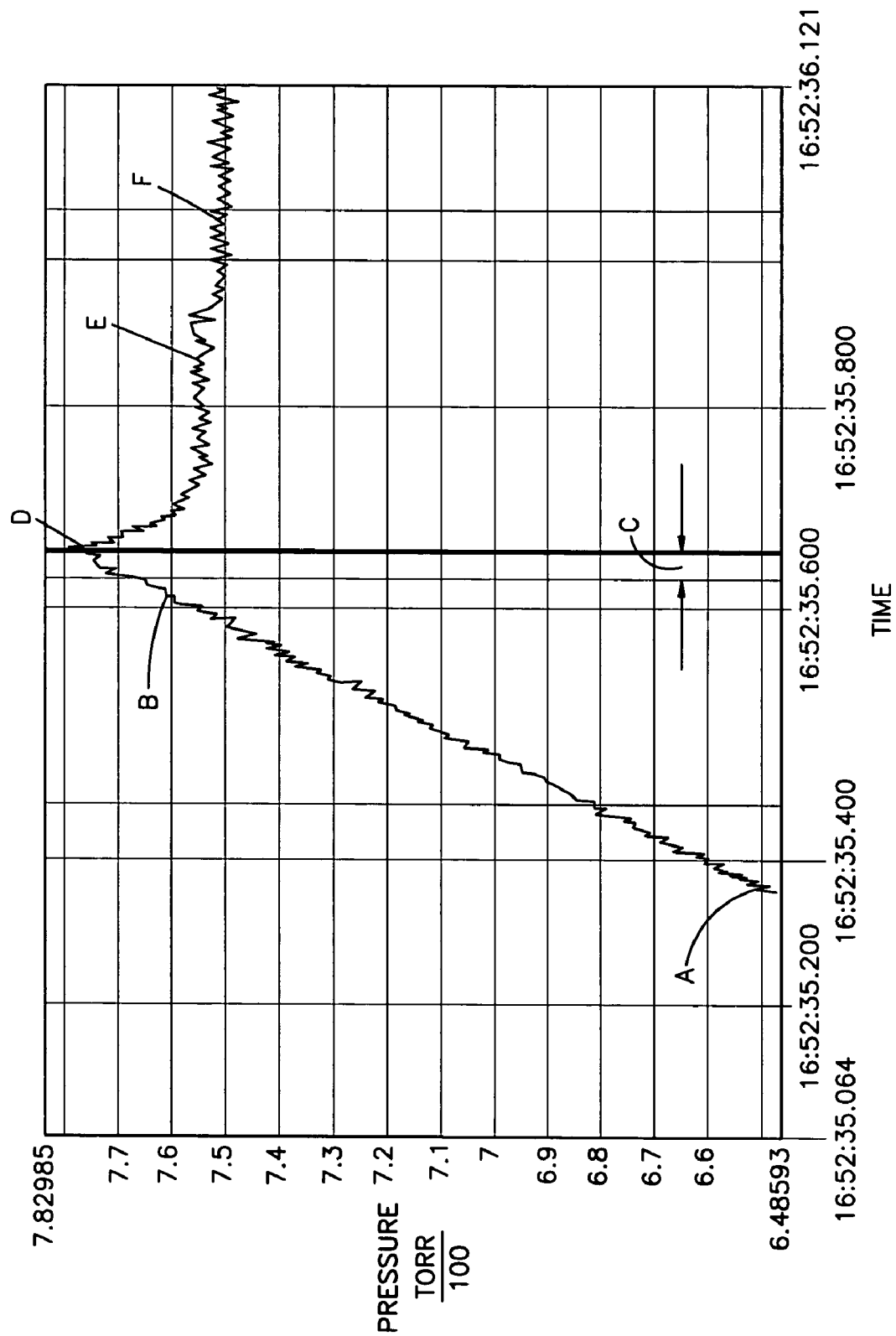
FIG. 4 is a timing diagram showing pressure versus time inside the load lock. This is the exemplary timing diagram for the exemplary system and the claims should cover alternate situations that might have alternate timing diagrams.

A second pressure set point used to trigger the vent sequence is set to one Torr above ambient atmospheric pressure or 761 Torr for standard atmosphere at sea level. (FIG. 4, "B"). The pressure trigger signal from the sensor 150 is directly coupled to the second controller 112. Receipt of a signal corresponding to the second threshold causes the controller 112 to open a fast acting valve 160 (approximately 30 milliseconds to open). Although receipt of the second set point trigger signal is locally and electrically connected to the PLC 112 and fast acting valve 160, there is approximately 20 ms delay between receipt of the second set point signal trigger and the start of the opening of the fast acting valve 160 (See FIG. 4, time interval "C". The combination of selecting a set point above ambient atmosphere and the short delay combine to guarantee that the loadlock is above local ambient atmosphere (regardless of actual atmospheric pressure at the time the loadlock is opened). While in the exemplary embodiment, the gauge 150 self calibrates if ambient atmospheric pressure varies by more than 10 Torr, the controller 110 could command gauge calibration to sensed atmospheric pressure at periodic intervals, as frequently as every cycle eliminating any meaningful variation as a result of atmospheric pressure changes. Opening the loadlock 60 to atmosphere when the loadlock is not at or above atmosphere could produce undesirable particle contamination and/or allow moisture from air in the region 122 into the loadlock, which could result in a slightly longer roughing time as the load lock is next pumped down. If pressure within the loadlock is still below atmosphere, ambient air would be directed into the loadlock. The pressure gauge 150 is periodically calibrated to ambient pressure through a software calibration command.

The signal to the controller 112 from the gauge 150 is an active high, low voltage signal. The controller 110 communicates with the gauge 150 by means of a two way serial communications and updates pressure readings returned from the gauge 150 on a user interface at a rate of 3-5 times per second, which is configurable. The trigger is a voltage output signal that indicates the trigger has been reached but does not provide pressure/vacuum readings to the controller 112.

The above sequence pressurizes the loadlock to a pressure approximately 10-30 Torr above atmosphere (FIG. 4, "D"). Once opened, the fast acting valve 160 begins to relieve gas from the loadlock interior to ambient atmosphere away from passthrough valves 130, 132. The loadlock pressure therefore begins to decline and stabilizes at a pressure of approximately 2-4 Torr above atmosphere (steady state loadlock overpressure) within milliseconds time (FIG. 4, "E").

This small but desirable loadlock over-pressure is due to the fact that the load lock interior is coupled to the nitrogen source 146 throughout the vent sequence. The positive pressure is desired so as not to allow external particles to enter the loadlock (or allow particles back through the fast acting valve 160) as the treated workpiece 24 is removed from the loadlock through one of the in air isolation valves 130, 132. At the same time, this positive pressure is sufficiently small in magnitude as to not induce particle generation and transport across the loadlock inair isolation valves 130, 132 when they begin to actuate.

The fast acting valve opening is followed by an empirically derived fixed time delay of 200 ms. This time delay is chosen to ensure pressure within the loadlock reaches the steady-state loadlock over-pressure of 2-4 Torr (mentioned above). This time delay could be altered depending on the system requirements. Incidental to the remainder of the vent sequence, the fast acting valve 160 closes after a separate fixed time delay and is ready for the next cycle.

Upon expiration of the 200 ms fixed time delay, the inair isolation valves 130, 132 are opened by the controller 112 exposing the chamber to ambient atmosphere (FIG. 4, "F"). Control signals from the controller 112 are routed thru a solenoid bank (not shown) that pneumatically activates drives for opening and closing the valves 130, 132. Commands to open and close the valves 130, 132, 134 come from the controller 112 after being scheduled by the controller 110. Feedback information from the valves is transmitted to both controllers 110, 112. Because the loadlock is above atmosphere, airflow is directed from the loadlock. Because the loadlock over pressure is small in magnitude, the airflow disturbance across the inair isolation valves 130, 132 does not create, dislodge or transport particles of sufficient size, quantity or distance to pose a threat to process wafers being transported through the system. The ambient atmosphere exposed to the loadlock in the region 122 is provided by a commercially available equipment-front-end module (EFEM) with integrated HEPA filtered airflow.

Flowchart

Figure 3:
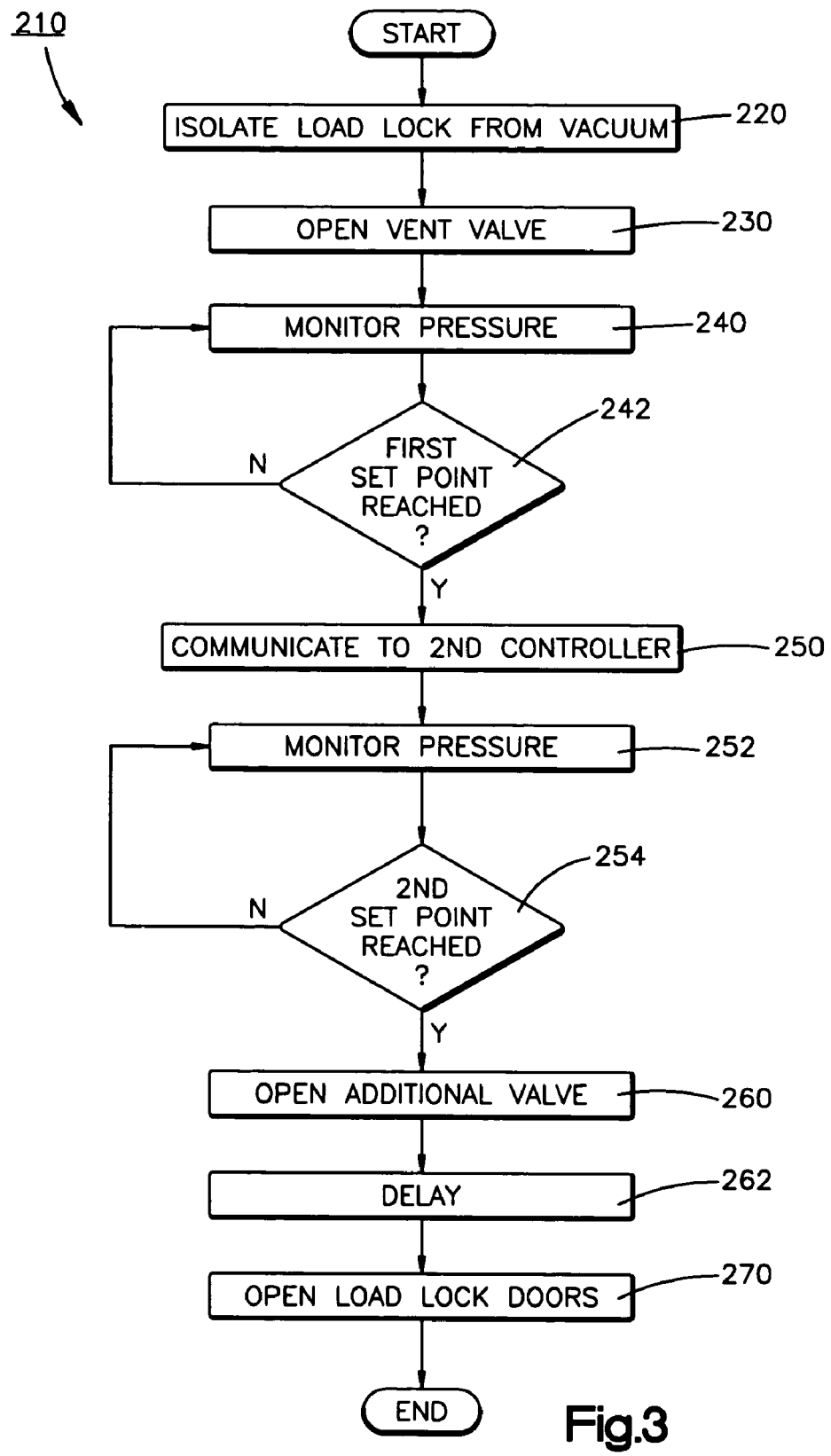
FIG. 3 is a flow diagram illustrating a vent process for use with the present invention.

FIG. 3 is a flowchart 210 of an exemplary sequence for use by the controllers 110, 112 in pressurizing the loadlock 60 in accordance with the invention. At a step 220 the isolation valve 134 coupling the loadlock interior to the ion implantation chamber is closed as commanded by the controller 110. The controller 110 checks various interlocks such as whether the valve 134 closes, and whether a workpiece is in the load lock and whether the valve 140 is closed before proceeding.

Assuming no faults are sensed, the controller 110 commands 230 a nitrogen vent valve 144 to open thereby causing a regulated supply 146 of nitrogen to deliver nitrogen to an interior of the load lock 60 at a controlled pressure of between 30 and 40 PSI. This value could be higher or lower for other loadlocks or other situations. If higher pressure is used, shorter venting times are achieved. Pressure is monitored 240 by the pressure gauge 150 and a signal related to pressure communicated to both controller 110, 112. The controller 110 obtains pressure reading updates through serial communications with the gauge 150. Controller 112 monitors trigger voltages sent from the gauge 150.

There are two thresholds that the controllers 110, 112 monitor during the process. The controller 110 monitors the sensed pressure to determine 242 when a first threshold is reached. Upon reaching the first threshold, the controller 110 sends a command 250 to the other controller 112 causing that second controller to begin to monitor 252 for a second threshold at which time the process of opening the two in air isolation valves 130, 132 begins. The second controller 112 tests 254 to determine when the second threshold pressure is reached by monitoring signals from the pressure sensor 150 (this is an above ambient signal).

When the necessary conditions of receipt of a signal from the first controller 110 and sensing an above atmosphere pressure threshold signal are met, the second controller 112 sends an open command 260 to a fast acting valve 160 which opens the load lock interior to ambient atmosphere. The second controller 112 initiates 262 a fixed time delay (in the exemplary embodiment about 200 milliseconds) before commanding 270 the in air isolation valves 130, 132 to open and allow workpiece transfer by one of the robots 80, 82. The fixed delay allows the loadlock to stabilize at a minimal value (about 2-4 Torr) above atmosphere pressure resulting from the continued nitrogen flow into the loadlock. Stated another way, the valve 144 continues to provide a continuous flow of Nitrogen such that flow out of the chamber to ambient atmosphere is maintained.

Once the loadlock doors are closed subsequent to removal of a treated workpiece for example, an untreated workpiece is inserted and the roughing cycle (pumpdown) is initiated. Roughing is initiated by the controller #1 with the valves 130, 132, 134, 144, 160 closed.

It is understood that although an exemplary embodiment of the invention has been described with a degree of particularity, alterations and modifications from that embodiment are included which fall within the spirit or scope of the appended claims.

The invention claimed is:

1. For use with a semiconductor processing tool having an evacuated region for treating a workpiece and a load station for delivering workpieces to and retrieving workpieces from the evacuated region, apparatus comprising:

a load lock including:
a passthrough valve for removal of and insertion of workpieces from and into a load lock interior;
a second valve to atmosphere; and
a pressure sensor, wherein said second valve is controlled by an output from said pressure sensor to relieve overpressure from the load lock prior to opening said passthrough valve.

2. The apparatus of claim 1 additionally comprising a control for monitoring a signal from the pressure sensor.

3. The apparatus of claim 2 wherein the control comprises a control output for controlling opening and closing of the passthrough valve.

4. The apparatus of claim 3 wherein the control comprises a control program that awaits receipt of a signal corresponding to a specified pressure above atmosphere before opening the passthrough valve.

5. The apparatus of claim 2 wherein the control comprises first and second controllers coupled to the pressure sensor and wherein one controller comprises a dedicated controller that only performs functions relating to controlling load lock valve actuators.

6. The apparatus of claim 5 wherein the second valve comprises a fast acting pressure relieving valve for venting the load lock interior to atmosphere and wherein the dedicated controller commands opening of the fast acting valve.

7. The apparatus of claim 6 wherein a delay is instituted by the dedicated controller between opening of the fast acting valve and opening of the passthrough valve.

8. In a semiconductor processing tool, a method of workpiece transfer from one pressure region to a second comprising:

providing a load lock having a loadlock interior and a first throughpassage which opens and closes for moving workpieces into and out of the loadlock and which opens to atmosphere and a second throughpassage which opens and closes for movement of a workpiece into and out of the loadlock and which opens to an evacuated region of an implanter;
initiating pressurization of the loadlock interior by coupling a source of pressurized gas to the loadlock interior;
monitoring a pressure rise as the gas source routes gas into the loadlock interior and when the pressure reaches an above atmosphere threshold pressure above atmosphere opening a pressure relieving valve to open the loadlock interior to atmosphere; and
opening the first throughpassage to allow workpieces to be inserted into the loadlock or allows workpieces within the loadlock to be removed.

9. The method of claim 8 additionally comprising instituting a delay between opening the pressure relieving valve and opening the first throughpassage to allow workpiece movement in relation to the loadlock.

10. The method of claim 8 wherein flow of gas into a chamber from the source of pressurized gas as a vent valve is opened to maintain above atmosphere pressure inside the load lock prior to opening the first throughpassage.

11. The method of claim 8 wherein two controllers monitor the pressure and wherein a first controller arms or activates a second dedicated controller when the pressure reaches a lower threshold pressure below atmospheric pressure.

* * * * *